United States Patent [19]
Tehrani et al.

[11] Patent Number: 5,699,293
[45] Date of Patent: Dec. 16, 1997

[54] METHOD OF OPERATING A RANDOM ACCESS MEMORY DEVICE HAVING A PLURALITY OF PAIRS OF MEMORY CELLS AS THE MEMORY DEVICE

[75] Inventors: Saied N. Tehrani, Tempe; Xiaodong T. Zhu, Chandler; Eugene Chen, Gilbert; Mark Durlam, Chandler, all of Ariz.

[73] Assignee: Motorola, Schaumburg, Ill.

[21] Appl. No.: 728,023

[22] Filed: Oct. 9, 1996

[51] Int. Cl.⁶ .................................................. G11C 11/00
[52] U.S. Cl. ........................ 365/158; 365/131; 365/171
[58] Field of Search .............................. 365/158, 48, 74, 365/82, 131, 149, 154, 157, 171, 173

[56] References Cited

U.S. PATENT DOCUMENTS

| | | | |
|---|---|---|---|
| 5,289,410 | 2/1994 | Katti et al. | 365/173 |
| 5,295,097 | 3/1994 | Lienau | 365/173 |
| 5,329,480 | 7/1994 | Wu et al. | 365/171 |
| 5,396,455 | 3/1995 | Brady et al. | 365/173 |
| 5,477,482 | 12/1995 | Prinz | 365/173 |
| 5,565,695 | 10/1996 | Johnson | 365/171 |
| 5,587,943 | 12/1996 | Torok et al. | 365/173 |

*Primary Examiner*—Tan T. Nguyen
*Attorney, Agent, or Firm*—Eugene A. Parsons

[57] ABSTRACT

A magnetic random access memory device (10) has a plurality of pairs of memory cells (21a, 21b), a column decoder (31), a row decoder (32), and a comparator (60). The pair of memory cells (21a, 21b) is designated by column decoder (31) and row decoder (32) in response to a memory address. Complementary bits ("0" and "1") are stored in the pair of memory cells (21a, 21b). When the state in the pair of memory cell (21a, 21b) is read, both bits in the pair of memory cells (21a, 21b) are compared to produce an output at one read cycle time to a bit line (70). This memory device omits a conventional auto-zeroing step so that a high speed MRAM device can be attained.

15 Claims, 2 Drawing Sheets

METHOD OF OPERATING A RANDOM ACCESS MEMORY DEVICE HAVING A PLURALITY OF PAIRS OF MEMORY CELLS AS THE MEMORY DEVICE

FIELD OF THE INVENTION

The present invention relates to a method of operating a random access memory device, and more particularly, to the method of operating the magnetoresistive random access memory device having a plurality of pairs of memory cells where complementary states are stored in the memory device.

BACKGROUND OF THE INVENTION

A variety of random access memories (RAMs), for example, a dynamic RAM and a static RAM, are currently used in a computer system for various purposes. The dynamic RAM, generally, has high speed read/write cycle time characteristics, however, it requires repeated replenishing charges stored on the capacitors in order to retain the information. The static RAM stores information in flip-flop elements typically made up of four to six transistors, and the information indefinitely remains in a given state until the information is intentionally changed. Both DRAM and SRAM are volatile.

A magnetoresistive RAM (MRAM) has been developed as a new type of memory, which is non-volatile. The MRAM has a plurality of memory cells which are arrayed and each cell has portions of magnetic material separated by a conductive or insulating spacer layer, word lines, and sense lines. Digital information is represented by the direction of magnetic vectors in the magnetic material and the information indefinitely remains in a given state until the information is intentionally changed by an opposite magnetic field over a threshold level.

An example of a MRAM structure is disclosed in U.S. Pat. No. 5,343,422 entitled "NONVOLATILE MAGNETORESISTIVE STORAGE DEVICE USING SPIN VALVE EFFECT". This patent teaches that a storage element has a substrate and a multilayered structure including two thin film layers of ferromagnetic material separated by a thin layer of non-magnetic metallic conducting material. The magnetization direction of one of two layers is fixed, and the magnetization direction of the other layer is free to switch between two digital states.

The memory is made of two transistors and two memory elements. The state of the memory cell is determined by comparing an active cell with a reference cell, which is set to a predetermined state using this method. The cell size is very large. Also since the memory cell is set to one predetermined state and an active cell is compared with reference cell. The signal is unipolar and small.

Accordingly, it is a purpose of the present invention to provide a new and improved MRAM which attains high speed operation with high signal output.

It is a further purpose of the present invention to provide a new and improved MRAM having not only high speed operation but also high density and low power consumption characteristics.

SUMMARY OF THE INVENTION

This need and others are substantially met through provision of a MRAM which has a plurality of pairs of memory cells. In a "write" mode, a pair of word lines associated with the pair of memory cells are connected in series. In a "read" mode, the pair of word lines are connected in parallel.

DETAILED DESCRIPTION OF THE PREFERRED EMBODIMENTS

Figure 1:
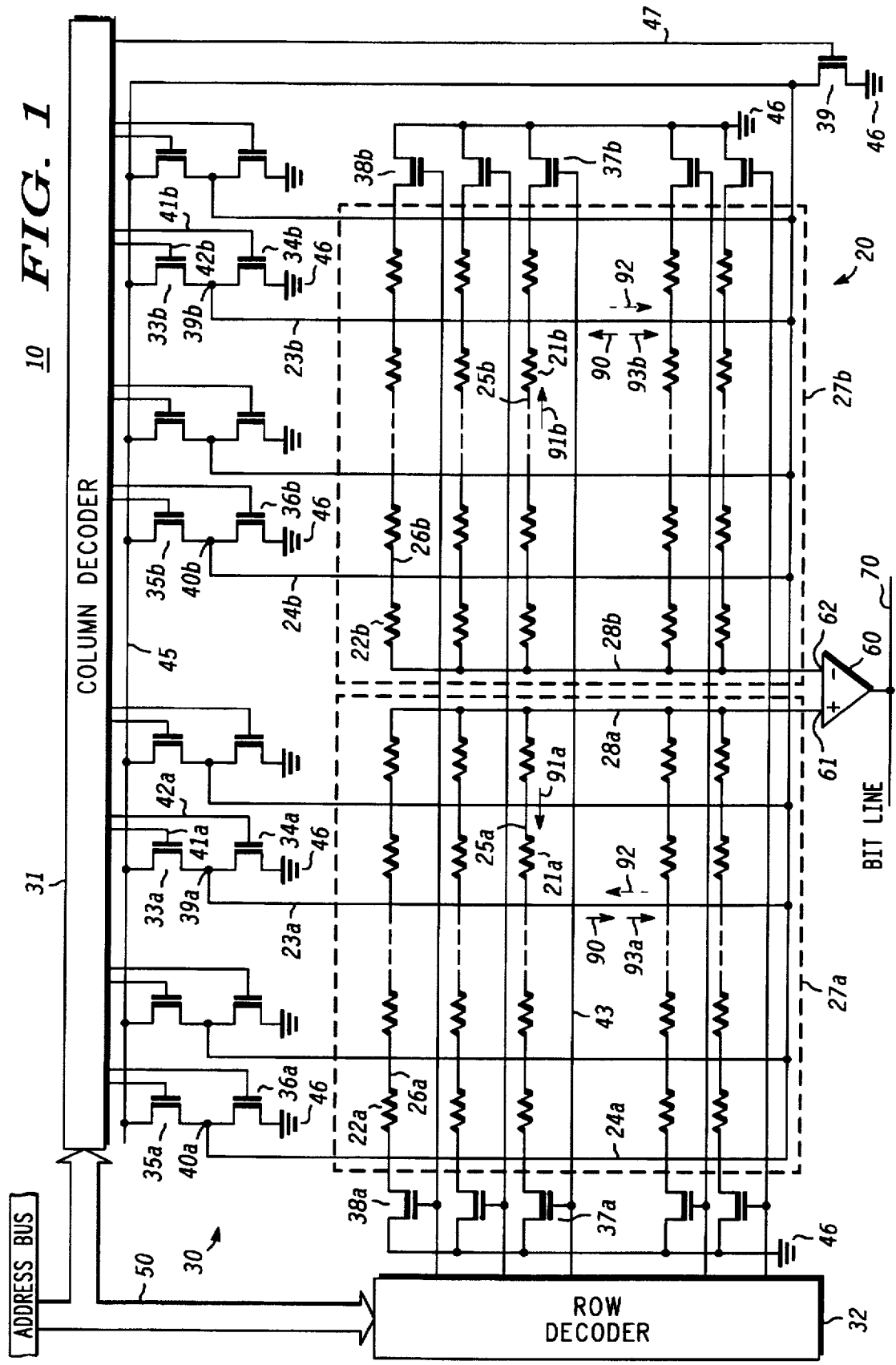
FIG. 1 shows simplified MRAM circuitry having a memory array where a plurality of pairs of memory cells are arranged.

FIG. 1 shows simplified MRAM circuitry 10 having a memory array 20, in which a plurality of pairs of memory cells are organized, where the pairs of memory cells are indicated as reference numbers 21 and 22, and suffixes "a" and "b" are added after the reference number 21 and 22 for the memory cells. A structure and characteristics of a typical memory cell are explained hereinafter in the discussion of FIGS. 2 and 3.

MRAM 10 consists of memory array 20, a decoder 30, and a comparator 60. These components are generally fabricated on a semiconductor substrate, and other circuits may be integrated on the same substrate.

Memory array 20 has a plurality of memory cells 21a, 22a, 21b, and 22b which are located on intersections of word lines 23a, 24a, 23a, and 24b, and sense lines 25a, 26a, 25b, and 26b. The plurality of memory cells 21a, 22a, 21b, and 22b are logically divided into first and second array portions 27a and 27b, indicated by dashed boxes. One memory cell of a pair of memory cells is located in first array portion 27a and the other memory cell of the pair of memory cells is located in second memory array portion 27b. For example, one memory cell 21a of the pair of memory cells 21a and 21b is located in first array portion 27a and the other memory cell 21b of the pair of memory cells 21a and 21b is located in second memory array portion 27b.

Decoder 30 has a column decoder 31 and a row decoder 32, both of which are connected to an address bus 50. Column decoder 31 includes switching transistors 33a, 34a, 35a, 36a, 33b, 34b, 35b, and 36b to switch word lines 23a, 24a, 23b, and 24b between a first potential or a power line 45 and a second potential or a ground line 46. Switching transistors 33a and 34a, for example, are connected in series between power line 45 and ground line 46. Gate electrodes of switching transistors 33a and 34a are connected to column decoder 31, respectively. Other switching transistors 35a and 36a, 33b and 34b, and 35b and 36b are also connected in series between power line 45 and ground line 46 the same as transistors 33a and 34a. Row decoder 32 includes switching transistors 37a, 38a, 37b, and 38b to connect sense lines 25a, 26a, 25b, and 26b to ground line 46. One end, sense line 25a is connected to a positive input 61 of comparator 60. Gate electrodes of switching transistors 37a and 37b are connected to row decoder 32. Other switching transistors 38a and 38b are connected in the same way as transistor 37a and 37b.

Word lines 23a and 23a are connected to the connections 39a and 39b of drain electrodes of switching transistors 33a and 34a, and 33b and 34b, respectively. Other word lines 24a and 24b are also connected to the connections 40a and 40b of drain electrodes of switching transistors 35a and 36a, and 35b and 36b, respectively. All the word lines 23a, 24a, 23a, and 24b are also connected to a drain of a switching transistor 39 and power line 45. A source electrode of switching transistor 39 is connected to ground line 46 and a gate electrode is connected to column decoder 31 by a line 47.

The other ends 28a of sense lines 25a and 26a are connected to positive input 61 of comparator 60, and the other ends 28b of sense lines 25b and 26b are connected to negative input 62 of comparator 60. An output of comparator 60 is connected to a bit line 70 where the state stored in the pair of memory cell 21a and 21b is provided.

Figure 2:
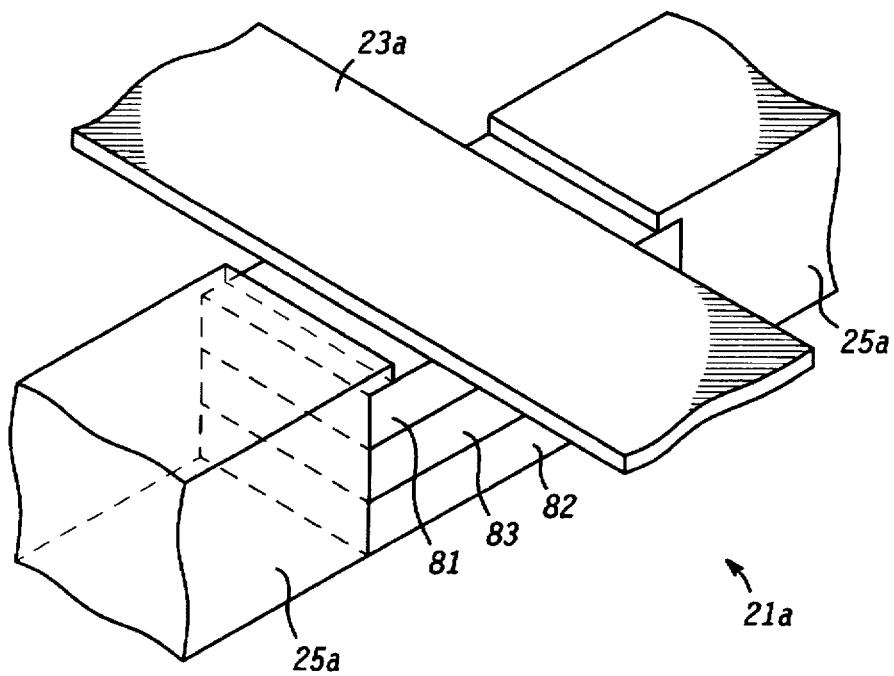
FIG. 2 shows a simplified and enlarged memory cell structure with magnetic material.

FIG. 2 shows a perspective view of a simplified and enlarged structure of memory cell 21a having multiple layers of magnetic material. Other memory cells 22a, 21b, and 22b also have the same structure as memory cell 21a. Memory cell 21a has a first magnetic layer 81 and a second magnetic layer 82 separated by a conductive layer 83. Layers 81 and 82 utilize magnetic material such as NiFeCo, and conductive layer 83 utilizes, for example, Copper (Cu). The three layers 81, 82, and 83 together form a giant magneto-resistive (GMR) material. Word line 23a, which carries a word current, is placed adjacent to first layer 81 in order to provide the GMR material with a magnetic field generated by the word current. Sense line 25a, which carries a sense current, is connected to GMR with ohmic contact to sense a magnetic resistance.

Memory cell 21a shown in FIG. 2 can be stacked on the top of other memory cell to attain memory array 20 having multiple layers of memory cells. The design of such memory stacks can be engineered to produce a random access memory device having a plurality of pairs of memory cells, as disclosed in U.S. Pat. Application entitled "A MAGNETIC RANDOM ACCESS EMORY HAVING STACKED MEMORY CELLS AND FABRICATION METHOD THEREFOR", filed Aug. 21, 1996, (Ser. No. 08/702,781) Motorola Docket No. CR95-178 and assigned to the same assignee.

In order to store or write a state in magnetic layers 81 and 82, a total magnetic field, which is created by magnetic fields provided by the word current and the sense current sufficient to switch the direction of magnetic vectors in magnetic layers 81 and 82, is applied to magnetic layers 81 and 82. To read the state in magnetic cell 21a, a voltage on sense line 25a is sensed because the voltage changes according to the direction of magnetic vectors in magnetic layers 81 and 82.

Figure 3:
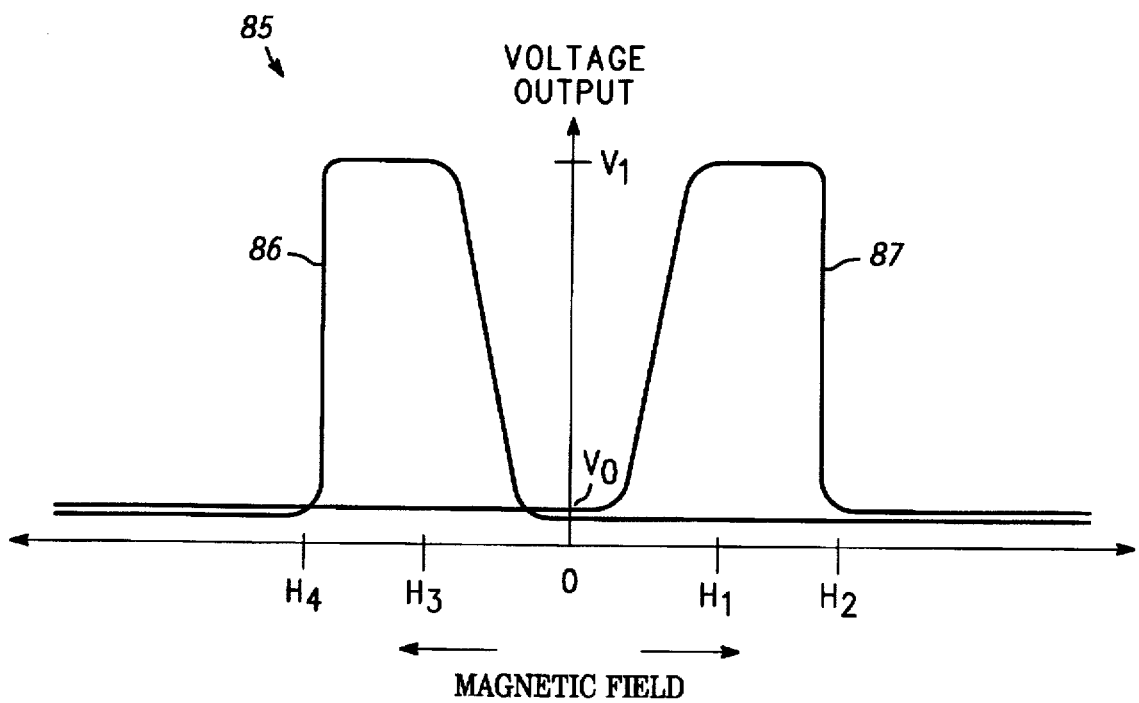
FIG. 3 shows a graph illustrating characteristics of the GMR material shown in FIG. 2.

FIG. 3 shows a graph 85 illustrating the resistance or voltage output of magnetic cell 21a (FIG. 1) verses the applied magnetic field or total magnetic field. The abscissa indicates magnetic field direction and strength, that is, the strength either supports or opposes the magnetic vectors of cell 21a. The ordinate represents the voltage output of cell 21a. A curve 86 indicates the magnetoresistance characteristic, via the output voltage, for various magnetic field intensities for one direction of magnetization vectors. A curve 87 indicates the magnetoresistance characteristic, via the output voltage, for the same magnetic field intensities for the opposite direction of magnetization vectors. To the right of zero, curves 86 and 87 indicate the output voltage for magnetic fields that support the vectors of curve 86 and oppose the vectors of curve 87, and magnetic fields to the left of zero support the vectors of curve 87 and oppose the vectors of curve 86. Typically, curves 86 and 87 cross the voltage axis at the same point and have the same minimum values. For the sake of explanation, curve 87 is shifted vertically a slight amount to show the differences between the curves.

At zero applied field, the voltage output ($V_0$) of cell 21a is approximately the same regardless of the magnetization vector direction. As the field increases from zero to $H_1$, curve 87 shows the voltage output of cell 21a having vectors that are opposed by the total magnetic field, and curve 86 shows the voltage of cell 21a having vectors that are supported the magnetic field. At magnetic field intensity of $H_1$, the vectors in memory cell 21a rotate and indicate the output voltage $V_1$. As the total magnetic field intensity increases between $H_1$ and $H_2$, the magnetic vectors of memory cell 21a continue to rotate and snap to the other direction near a field intensity of $H_2$. Near $H_2$, the vectors of memory cell 21a snap to the opposite direction and the resistance decreases for values of $H_2$ and above. Similarly, the output voltage for an opposite direction total magnetic field is shown between zero and $H_3$ to $H_4$.

Referring to FIG. 1, the operation of MRAM circuitry 10 is described hereinafter. In order to store a first state, for example, a logic "1" in the pair of memory cells 21, the following steps are carried out. An address, which shows a location of the pair of memory cells 21a and 21b, is provided to column decoder 31 and row decoder 32 through address bus 50. Column decoder 31 provides turn-on signals on lines 41a and 41b to gate electrodes of switching transistors 33a and 34b, respectively. When switching transistors 33a and 34b turn on, a word current 90, indicated by a solid arrow, is applied to word lines 23a and 23a. These signals allow the flow of word current 90 from power line 45 through switching transistor 33a, word lines 23a and 23a, and switching transistor 34b to ground line 46. Therefore, word lines 23a and 23aare connected in series between power line 45 and ground line 46. Row decoder 32 provides a turn-on signal on line 43 to gate electrodes of switching transistors 37a and 37b. This signal allows sense currents 91a and 91b, indicated by solid arrows, to flow in sense lines 25a and 25b, respectively. Consequently, total magnetic fields ($H_2$ and above in FIG. 3) generated by word current 90 and sense currents 91a and 91b are applied to memory cells 21a and 21b, respectively. Then, a logic "1" is stored in the pair of memory cells 21a and 21b. It should be noted that, since the word current travels in series through cells 21a and 21b, for example, the word current travels in different directions through cells 21a and 21b and, consequently, opposite states are stored in cells 21a and 21b.

Next, in order to store a second state, for example, a logic "0" in the pair of memory cells 21a and 21b, a word current 92 having a direction indicated by a dashed arrow which is reverse to word current 90 is provided to word lines 23a and 23b to apply a magnetic field in a reverse direction. That is, column decoder 31 provides turn-on signals on lines 42a and 42b to gate electrodes of switching transistors 33b and 34a, respectively. Then, word current 92 flows from power line 45 though switching transistor 33b, word lines 23b and 23a, and switching transistor 34a to ground level 46. Therefore, word lines 23a and 23b are connected in series between power line 45 and ground line 46. Row decoder 32 provides a turn-on signal on line 43 to gate electrodes of switching transistors 37a and 37b. Consequently, total magnetic fields ($H_4$ and above in FIG. 3), which have an opposite direction, generated by word current 92 and sense current 91a and 91b are applied to memory cells 21a and 21b to store the logic "0" therein. The above processes are carried out to store the state in other pairs of memory cells 22.

As mentioned above, in the "write" mode, word currents 90 and 92 flow from power line 45 to ground line 46 through word lines 23a and 23b. This means that the same current is applied to store the two opposite bits "0" and "1" in the pair of cells at the same time so that the power consumption is reduced to half compared to the current required to separately store the states to the pair of memory cells.

In order to sense or read the state in the pair of magnetic cells 21a and 21b, for example, an address is provided through address bus 50 to column decoder 31 and row decoder 32 to designate a location of the pair of magnetic cells. Column decoder 31 provides turn-on signals on lines 41a, 42b, and 47 to turn on switching transistors 33a, 33b, and 39, thereby word current 93a is applied from power line 45 through switching transistor 33a, word line 23a, and switching transistor 39 to ground line 46, and word current 93b is applied from power line 45 through switching transistor 33b, word line 23a, and switching transistor 39 to ground line 46. Therefore, word lines 23a and 23b are connected in parallel between power line 45 and ground line 46. Row decoder 32 provides a turn-on signal on line 43 to gate electrodes of switching transistors 37a and 37b. Consequently, a total magnetic field ($H_1$ or between $H_1$ and $H_2$ in FIG. 3) generated by word current 93a and sense current 91a, and a total magnetic field ($H_1$ or between $H_1$ and $H_2$ in FIG. 3) generated by word current 93b and sense current 91b are applied to memory cells 21a and 21b, respectively. The voltages of sense lines 25a and 25b are provided to inputs 61 and 62 of comparator 60 which determines the difference of input voltages. The difference voltage amplified by comparator 60 is provided to bit line 70.

As mentioned above, two bits, which are complimentary, are stored in the pair of memory cells. For example, when a logic "1" is stored in one memory cell of the pair of memory cells, then a logic "0" is stored in the other memory cell of the pair of memory cells at the same time. When a logic "0" and a logic "1" are stored in memory cells 21a and 21b, output voltages $V_1$ and $V_0$ are sensed on lines 28a and 28b and provided to inputs 61 and 62 of comparator 60, respectively. Accordingly, a voltage corresponding to $V_1-V_0$ is provided from comparator 60. Contrary to the above, when a logic "1" and a logic "0" are stored in memory cells 21a and 21b, output voltages $V_0$ and $V_1$ are sensed on lines 28a and 28b and provided to inputs 61 and 62 of comparator 60, respectively. Accordingly, a voltage corresponding to $V_0-V_1$ is provided from comparator 60.

In the "read" mode, the contents of the pair of memory cells are evaluated and compared to determine the state stored in the pair of memory cells at the same time. This means that the present invention requires only one read cycle and supplies a sense voltage twice as high as the prior art. Therefore, the present invention attains a high speed MRAM having a high output voltage.

As shown in FIG. 2, the memory cell has a very simple structure and architecture, therefore, the MRAM has more flexibility in an IC design and also can be fabricated at lower cost. Further, the MRAM can attain not only high speed characteristics but also a high density because this simple architecture makes it possible to stack memory cells on top of other memory cell and put many memory cells with one transistor.

We claim:

1. A method of operating a magnetic random access memory having a plurality of pairs of memory cells comprising the steps of:
   connecting a pair of word lines associated with the pair of memory cells in series in a "write" mode and connecting the pair of the word lines in parallel in a "read" mode; and
   connecting a pair of sense lines associated with the pair of memory cells in parallel.

2. The method of claim 1 wherein the step of connecting a pair of word lines associated with the pair of memory cells in series in a "write" mode includes a step of connecting one end of the word lines connected in series to a first voltage level and connecting the other end of the word lines connected in series to a second voltage level lower than the first voltage level, respectively.

3. The method of claim 2 wherein the step of connecting one end of the word lines connected in series to a first voltage level and connecting the other end of the word lines connected in series to a second voltage level includes a step of connecting the one end of the word lines connected in series to a power voltage level and connecting the other end of the word lines connected in series to a ground level, respectively.

4. The method of claim 1 wherein the step of connecting a pair of word lines in parallel in a "read" mode includes a step of connecting both of one ends of the word lines connected in parallel to a first voltage level and connecting both of the other ends of the word lines connected in parallel to a second voltage level lower than the first voltage level, respectively.

5. The method of claim 4 wherein the step of connecting both of one ends of the word lines connected in parallel to a first voltage level and connecting both of the other ends of the word lines connected in parallel to a second voltage level includes a step of connecting both of one ends of the word lines connected in parallel to a power voltage level and connecting both of the other ends of the word lines connected in parallel to a ground voltage level, respectively.

6. The method of claim 1 wherein the step of connecting a pair of sense lines associated with the pair of memory cells in parallel includes a step of connecting both one ends of the pair of sense lines to a ground voltage level and connecting both of the other ends of the pair of sense lines to inputs of a comparator.

7. The method of claim 1 wherein the step of connecting a pair of word lines in series in a "write" mode and in parallel in a "read" mode includes a step of selecting the word lines corresponding to a memory address, and the step of connecting a pair of sense lines includes a step of selecting the sense lines corresponding to the memory address.

8. The method of claim 1 further including a step of evaluating states stored in the pair of memory cells to produce an output.

9. The method of claim 8 further including a step of providing the output to a bit line.

10. The method of claim 1 further including a step of storing a first state and a second state opposite to the first state in the pair of memory cells, respectively.

11. A method of operating a magnetic random access memory having a plurality of pairs of memory cells, a plurality of pairs of word lines, and a plurality of pairs of sense lines, each memory cell being located adjacent an intersection of the word line and the sense line, the method comprising the steps of:
   connecting one end of the pair of word lines connected in series to a first voltage level and an other end of the pair of word lines connected in series to a second voltage level lower than the first voltage level in a "write" mode, and connecting both of one ends of the pair of word lines connected in parallel to the first voltage level and both of the other ends of the pair of word lines connected in parallel to the second voltage level in a "read" mode;
   connecting both one ends of the pair of sense lines to the second voltage level and each of the other ends of the pair of sense lines to a first input and a second input of a comparator, respectively; and evaluating voltage levels applied at the first input and the second input of the comparator to produce an output.

12. A magnetic random access memory device comprising:

a memory array comprising:

a plurality of pairs of memory cells, each memory cell having a portion of magnetic material for storing states, a plurality of pairs of word lines, a pair of word lines being associated with a pair of memory cells for providing a word current by which magnetic fields for storing and sensing states are applied to portions of magnetic material in the pair of memory cells, and a plurality of pairs of sense lines, a pair of sense lines being associated with the pair of memory cells for sensing states stored in the pair of memory cells;

a comparator, connected to the pair of sense lines, for evaluating states in the pair of memory cells to produce an output;

a first decoder for connecting the pair of word lines in series in a "write" mode and connecting the pair of word lines in parallel in a "read" mode; and a second decoder for connecting the pair of sense lines in parallel to inputs of a detector;

wherein a first state and a second state opposite to the first state are stored in each pair of memory cells designated by the first and second decoders.

13. The magnetic random access memory device of claim 12 wherein the output from the comparator is provided to a bit line.

14. The magnetic random access memory device of claim 12 wherein the magnetic random access memory device is integrated on a semiconductor substrate.

15. The magnetic random access memory device of claim 12 wherein the magnetic material is giant magnetoresistive material.

* * * * *

UNITED STATES PATENT AND TRADEMARK OFFICE
CERTIFICATE OF CORRECTION

PATENT NO. : 5,699,293
DATED : December 16, 1997
INVENTOR(S) : Tehrani et al.

It is certified that error appears in the above-identified patent and that said Letters Patent is hereby corrected as shown below:

Column 1,
Line 4, after the Title, please add as a new first paragraph the following paragraph:
   -- This invention was made with Government support under Agreement No. MDA972-96-3-0016 awarded by DARPA. The Government has certain rights in the invention. --

Signed and Sealed this

Nineteenth Day of August, 2003

JAMES E. ROGAN
*Director of the United States Patent and Trademark Office*